United States Patent
Morikado

(10) Patent No.: US 8,154,069 B2
(45) Date of Patent: Apr. 10, 2012

(54) NAND FLASH MEMORY WITH SELECTION TRANSISTOR HAVING TWO-LAYER INTER-LAYER INSULATION FILM

(75) Inventor: Mutsuo Morikado, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 11/845,376

(22) Filed: Aug. 27, 2007

(65) Prior Publication Data

US 2008/0048243 A1 Feb. 28, 2008

(30) Foreign Application Priority Data

Aug. 28, 2006 (JP) ................................. 2006-231145

(51) Int. Cl.
*H01L 29/788* (2006.01)
(52) U.S. Cl. ........ 257/316; 257/314; 257/315; 257/324; 257/E29.3
(58) Field of Classification Search .......... 257/314–316, 257/324, E29.3
See application file for complete search history.

(56) References Cited

U.S. PATENT DOCUMENTS

| | | | |
|---|---|---|---|
| 6,580,117 B2 | 6/2003 | Shimizu | |
| 7,049,653 B2 | 5/2006 | Matsui et al. | |
| 2005/0002231 A1* | 1/2005 | Ozawa et al. | 365/185.01 |
| 2005/0199938 A1* | 9/2005 | Sakuma et al. | 257/314 |
| 2006/0231822 A1* | 10/2006 | Kim | 257/1 |

FOREIGN PATENT DOCUMENTS

| | | |
|---|---|---|
| JP | 11-330426 | 11/1999 |
| JP | 2002-176114 | 6/2002 |
| JP | 2002-252291 | 9/2002 |
| JP | 2005-26590 | 1/2005 |

OTHER PUBLICATIONS

Office Action issued Oct. 12, 2010, in Japan Patent Application No. 2006-231145 (with English-language Translation).

* cited by examiner

*Primary Examiner* — Anh Phung
*Assistant Examiner* — Allison Bernstein
(74) *Attorney, Agent, or Firm* — Oblon, Spivak, McClelland, Maier & Neustadt, L.L.P.

(57) ABSTRACT

A nonvolatile semiconductor memory includes a memory cell string having a plurality of memory cell transistors connected in series, a selection gate transistor connected in series with one end of the memory cell string, and having a gate electrode provided on a gate insulating film on a semiconductor substrate, and an element isolation insulating layer which is provided in the semiconductor substrate. The gate electrode includes a first gate electrode provided on the gate insulating film, a first and second insulating films provided on the first gate electrode, and a second gate electrode provided on the second insulating film and the element isolation insulating layer, and electrically connected to the first gate electrode. An first upper surface portion of the element isolation insulating layer below the second gate electrode is leveled with an upper surface of the first gate electrode.

8 Claims, 13 Drawing Sheets

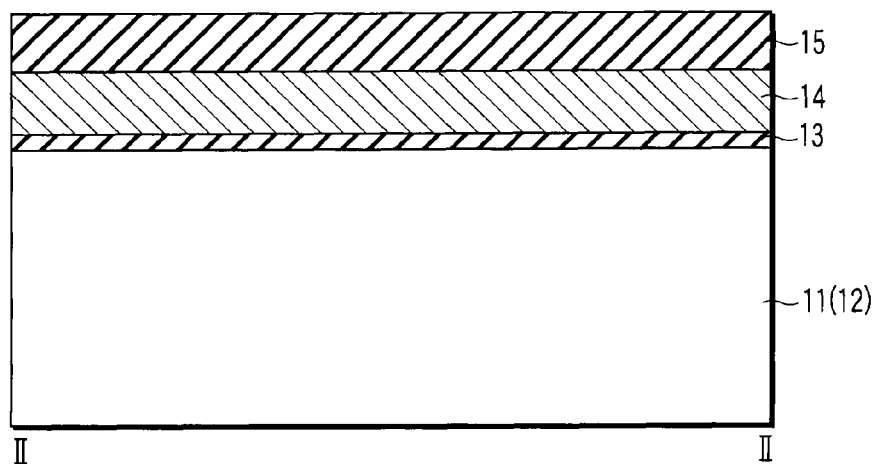
F I G. 6
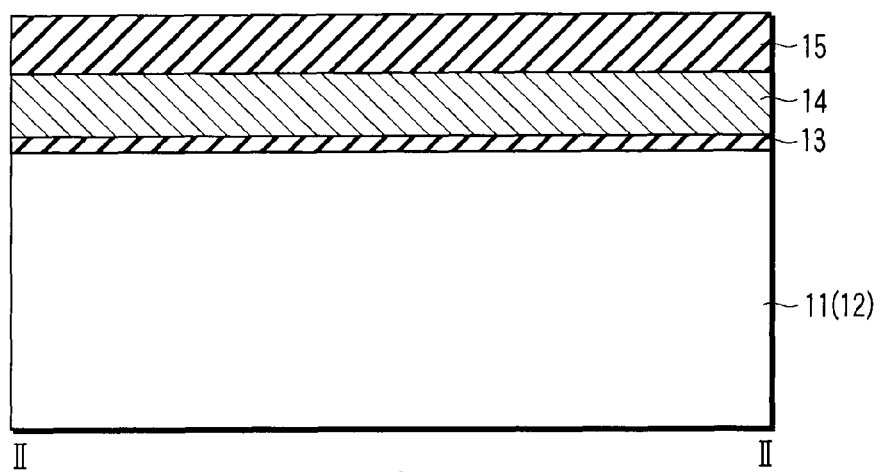
F I G. 7
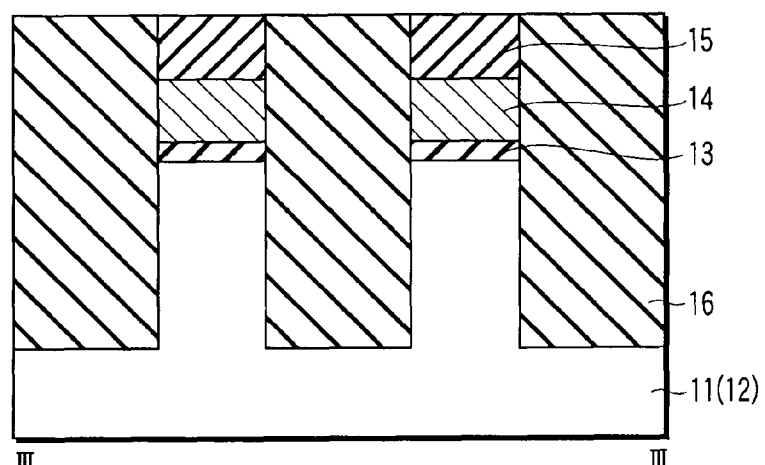
F I G. 8

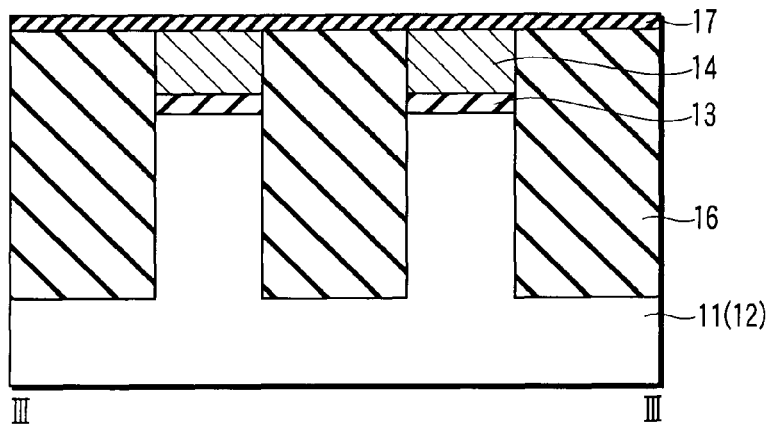
F I G. 12
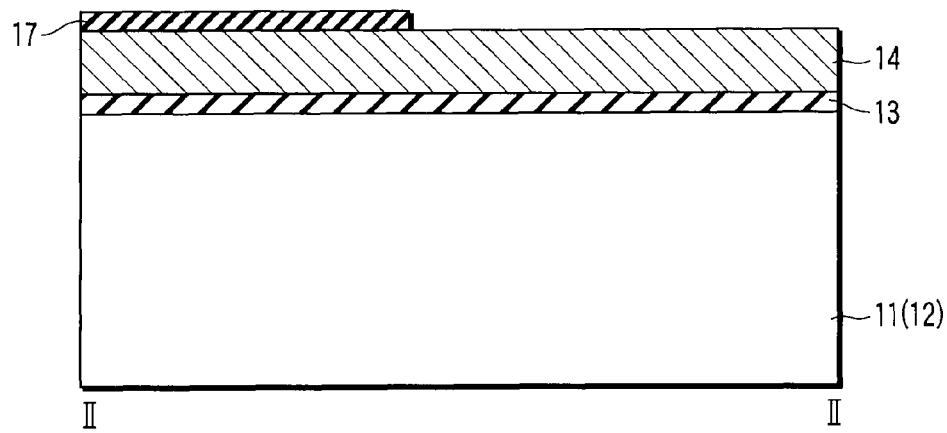
F I G. 13
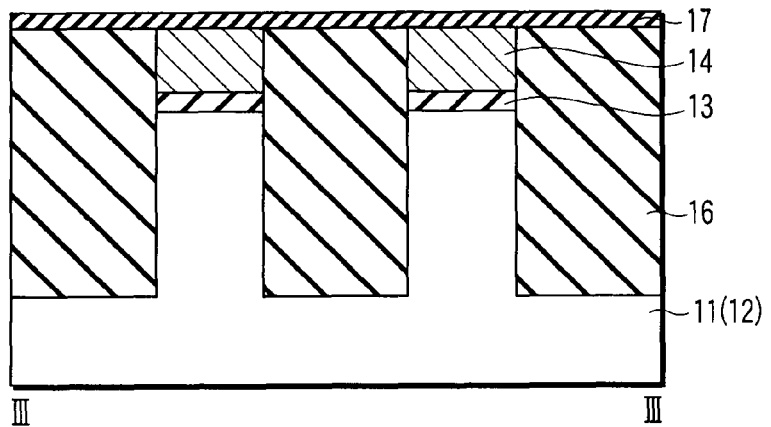
F I G. 14

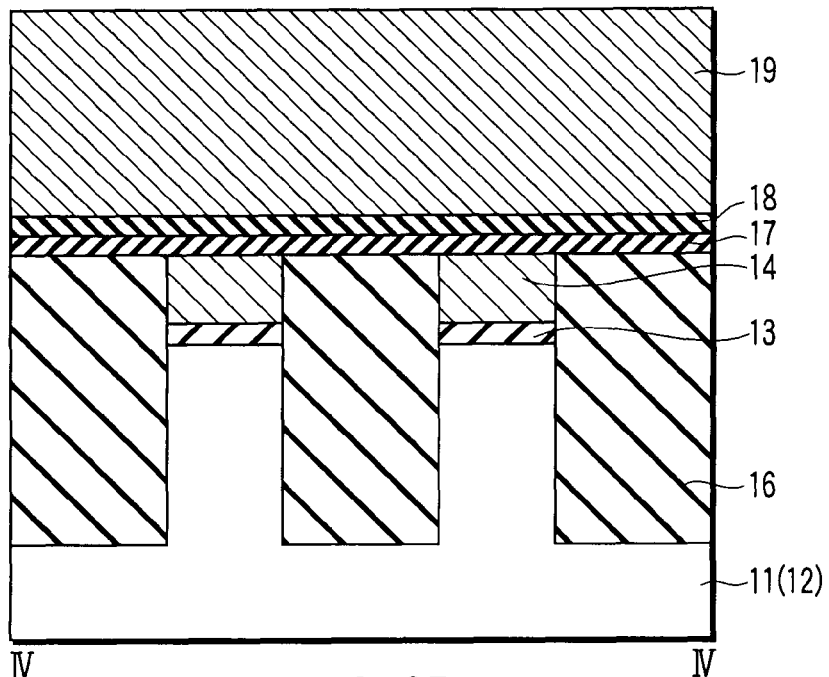
F I G. 25
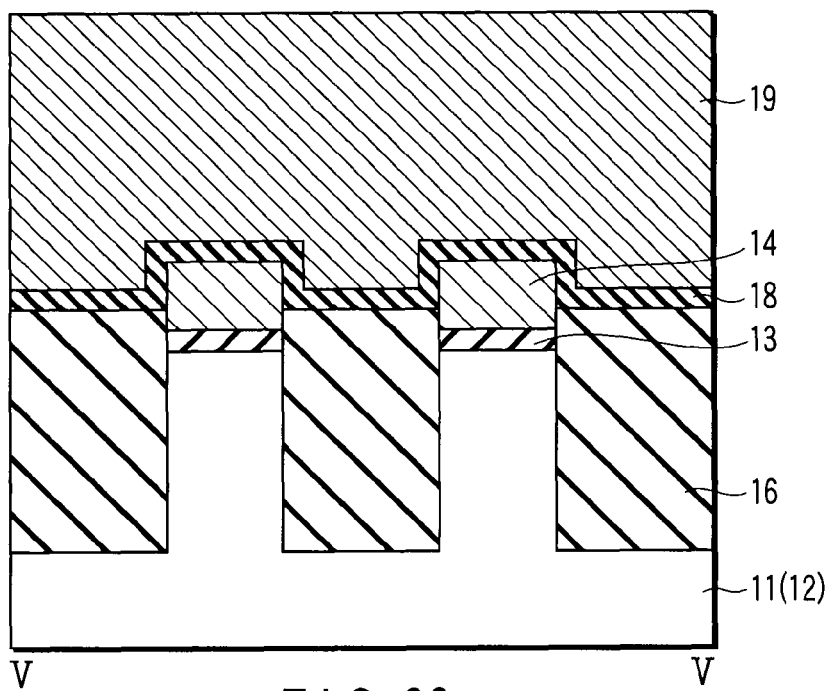
F I G. 26

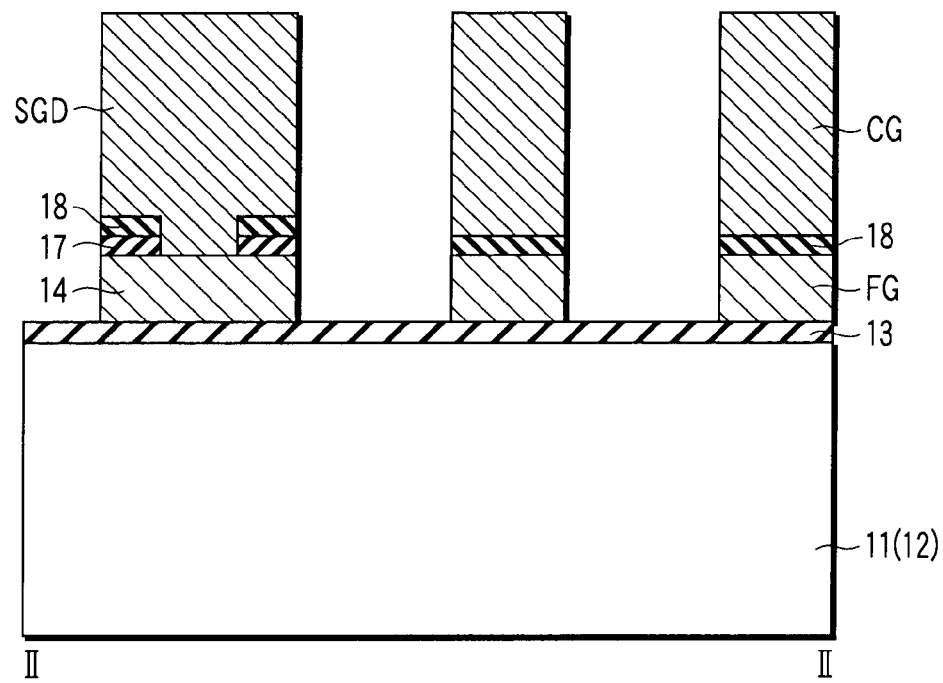
F I G. 27
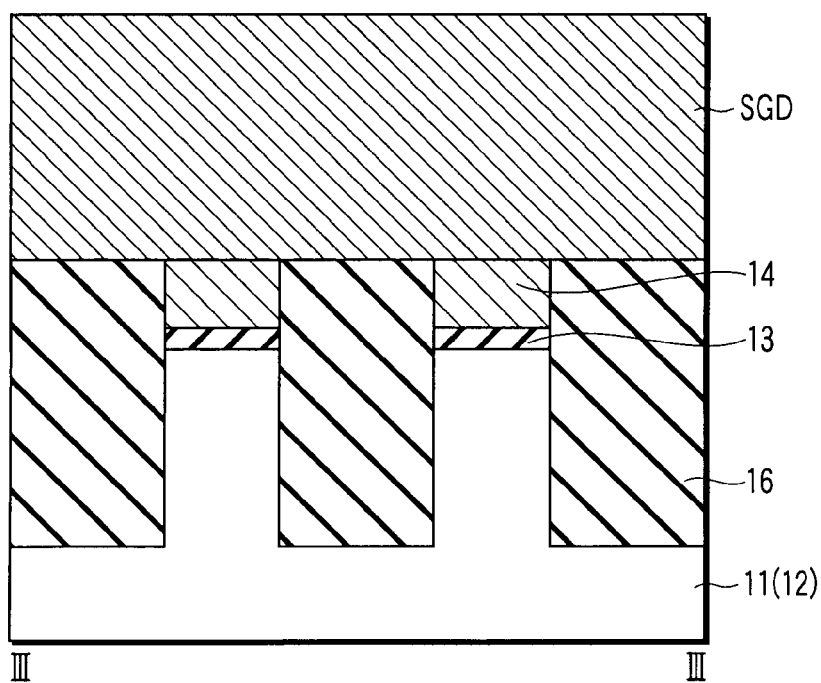
F I G. 28

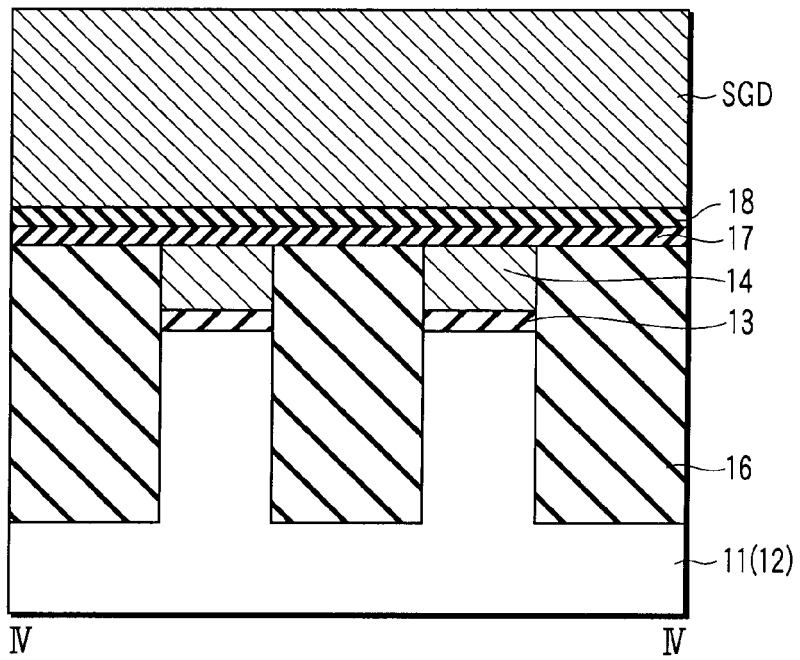
F I G. 29
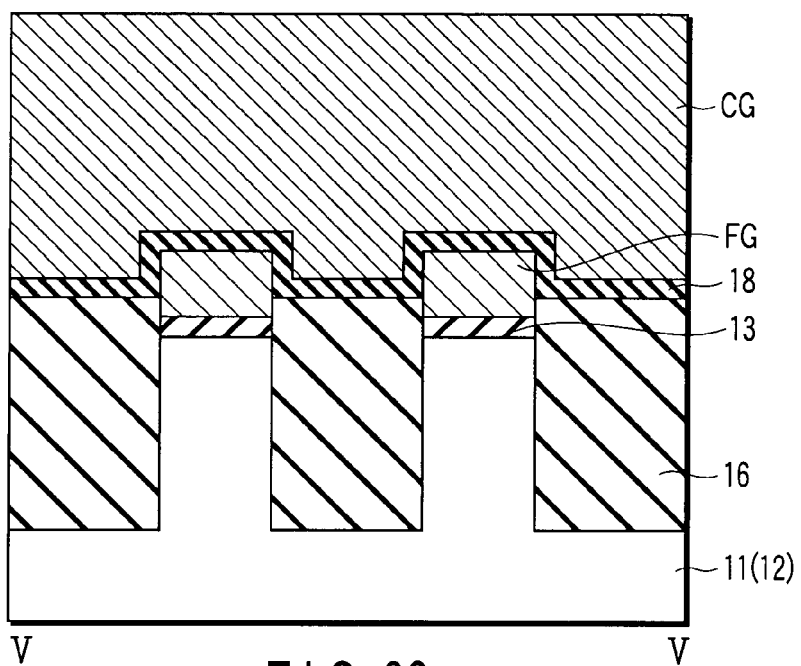
F I G. 30

NAND FLASH MEMORY WITH SELECTION TRANSISTOR HAVING TWO-LAYER INTER-LAYER INSULATION FILM

CROSS-REFERENCE TO RELATED APPLICATIONS

This application is based upon and claims the benefit of priority from prior Japanese Patent Application No. 2006-231145, filed Aug. 28, 2006, the entire contents of which are incorporated herein by reference.

BACKGROUND OF THE INVENTION

1. Field of the Invention

The present invention relates to a nonvolatile semiconductor memory and a manufacturing method thereof and, more particularly, to a nonvolatile semiconductor memory and a manufacturing method thereof using a nonvolatile memory cell formed by stacking a charge storage layer and control gate electrode.

2. Description of the Related Art

An electrically erasable programmable read-only memory (EEPROM) in which data write and erase are electrically performed is conventionally known as a semiconductor memory. Also, a NAND flash memory that can be highly integrated is known as one EEPROM.

A memory cell transistor of the NAND flash memory has a laminated gate structure in which a floating gate electrode for storing electric charge, an inter-gate insulating film, and a control gate electrode are stacked on a tunnel insulating film on a semiconductor substrate.

Micropatterning of the memory cell transistors of the NAND flash memories is rapidly advancing, and the inter-cell interference is an example of the characteristics that make this micropatterning difficult. When writing data in a memory cell transistor of interest and then writing data in a memory cell transistor adjacent to the cell of interest, the potential of the floating gate electrode of the cell of interest fluctuates under the influence of the potential of the floating gate electrode (or the amount of electric charge injected in the floating gate electrode) of the adjacent cell. The inter-cell interference is the characteristic that the data written in the cell of interest changes owing to this potential fluctuation.

The influence of the change in written data on the device characteristics increases as the number of levels of data to be written in one memory cell transistor increases and the distance between the floating gate electrodes decreases. Increasing the number of levels of data is an essential characteristic of the NAND flash memory whose advantage is a high density. To suppress the inter-cell interference, therefore, it is possible to decrease the parasitic capacitance of the floating gate electrode by decreasing its film thickness.

Decreasing the film thickness of the floating gate electrode has the merit that the inter-cell interference is suppressed. On the other hand, it is necessary to short-circuit the control gate electrodes and floating gate electrodes of the gate electrodes of two selection gate transistors arranged at the two ends of a memory cell string (formed by connecting a plurality of memory cell transistors in series). If the film thickness of the floating gate electrode is decreased, therefore, the margin of a short circuit between the floating gate electrode and semiconductor substrate decreases, and this decreases the yield.

As a related technique of this kind, a technique is disclosed that suppresses crystal defects of a semiconductor substrate caused by expansion of an element isolation insulating film by forming a silicon nitride layer on the inner walls of an element isolation trench, thereby improving the electrical characteristics and reliability of a nonvolatile semiconductor memory (Jpn. Pat. Appln. KOKAI Publication No. 2002-252291 [corresponding U.S. Pat. No. 6,580,117]).

BRIEF SUMMARY OF THE INVENTION

According to a first aspect of the present invention, there is provided a nonvolatile semiconductor memory comprising: a semiconductor substrate; a memory cell string having a plurality of memory cell transistors connected in series and arranged in a first direction; a selection gate transistor connected in series with one end of the memory cell string, and having a gate electrode provided on a gate insulating film on the semiconductor substrate; and an element isolation insulating layer which is provided in the semiconductor substrate, and electrically isolates selection gate transistors adjacent in a second direction perpendicular to the first direction and memory cell strings adjacent in the second direction. The gate electrode includes a first gate electrode provided on the gate insulating film, a first insulating film provided on a portion of the first gate electrode, a second insulating film provided on the first insulating film, and a second gate electrode extending in the second direction, provided on the second insulating film and the element isolation insulating layer, and electrically connected to the first gate electrode. An first upper surface portion of the element isolation insulating layer below the second gate electrode is leveled with an upper surface of the first gate electrode.

According to a second aspect of the present invention, there is provided a method of manufacturing a nonvolatile semiconductor memory, comprising: sequentially depositing a gate insulating film and a first gate electrode on a semiconductor substrate having a memory region and a peripheral circuit region; forming an element isolation insulating layer in portions of the semiconductor substrate, the gate insulating film, and the first gate electrode, an upper surface of the element isolation insulating layer being leveled with an upper surface of the first gate electrode; forming a first insulating film on first portions of the first gate electrode and element isolation insulating layer corresponding to the peripheral circuit region; etching the element isolating insulating layer by using the first insulating film as a mask, thereby lowering an upper surface of a second portion of the element isolation insulating layer corresponding to the memory region; forming a second insulating film on the first insulating film and on a second portion of the first gate electrode corresponding to the memory region; forming a control gate electrode on a portion of the second insulating film corresponding to the memory region; and forming a second gate electrode electrically connected to the first gate electrode, on the first portions of the first gate electrode and element isolation insulating layer.

BRIEF DESCRIPTION OF THE SEVERAL VIEWS OF THE DRAWING

FIG. 6 is a sectional view illustrating a manufacturing step of the NAND flash memory according to the embodiment of the present invention;

FIG. 7 is a sectional view taken along the line II-II and illustrating a manufacturing step of the NAND flash memory following FIG. 6;

FIG. 8 is a sectional view taken along the line III-III and illustrating a manufacturing step of the NAND flash memory following FIG. 6;

FIG. 12 is a sectional view taken along the line III-III and illustrating a manufacturing step of the NAND flash memory following FIG. 10;

FIG. 13 is a sectional view taken along the line II-II and illustrating a manufacturing step of the NAND flash memory following FIG. 11;

FIG. 14 is a sectional view taken along the line III-III and illustrating a manufacturing step of the NAND flash memory following FIG. 12;

FIG. 25 is a sectional view taken along the line IV-IV and illustrating a manufacturing step of the NAND flash memory following FIG. 21;

FIG. 26 is a sectional view taken along the line V-V and illustrating a manufacturing step of the NAND flash memory following FIG. 22;

FIG. 27 is a sectional view taken along the line II-II and illustrating a manufacturing step of the NAND flash memory following FIG. 23;

FIG. 28 is a sectional view taken along the line III-III and illustrating a manufacturing step of the NAND flash memory following FIG. 24;

FIG. 29 is a sectional view taken along the line IV-IV and illustrating a manufacturing step of the NAND flash memory following FIG. 25; and FIG. 30 is a sectional view taken along the line V-V and illustrating a manufacturing step of the NAND flash memory following FIG. 26.

DETAILED DESCRIPTION OF THE INVENTION

An embodiment of the present invention will be explained below with reference to the accompanying drawing. Note that in the following explanation, the same reference numbers denote elements having the same functions and arrangements, and a repetitive explanation will be made only when necessary.

Figure 1:
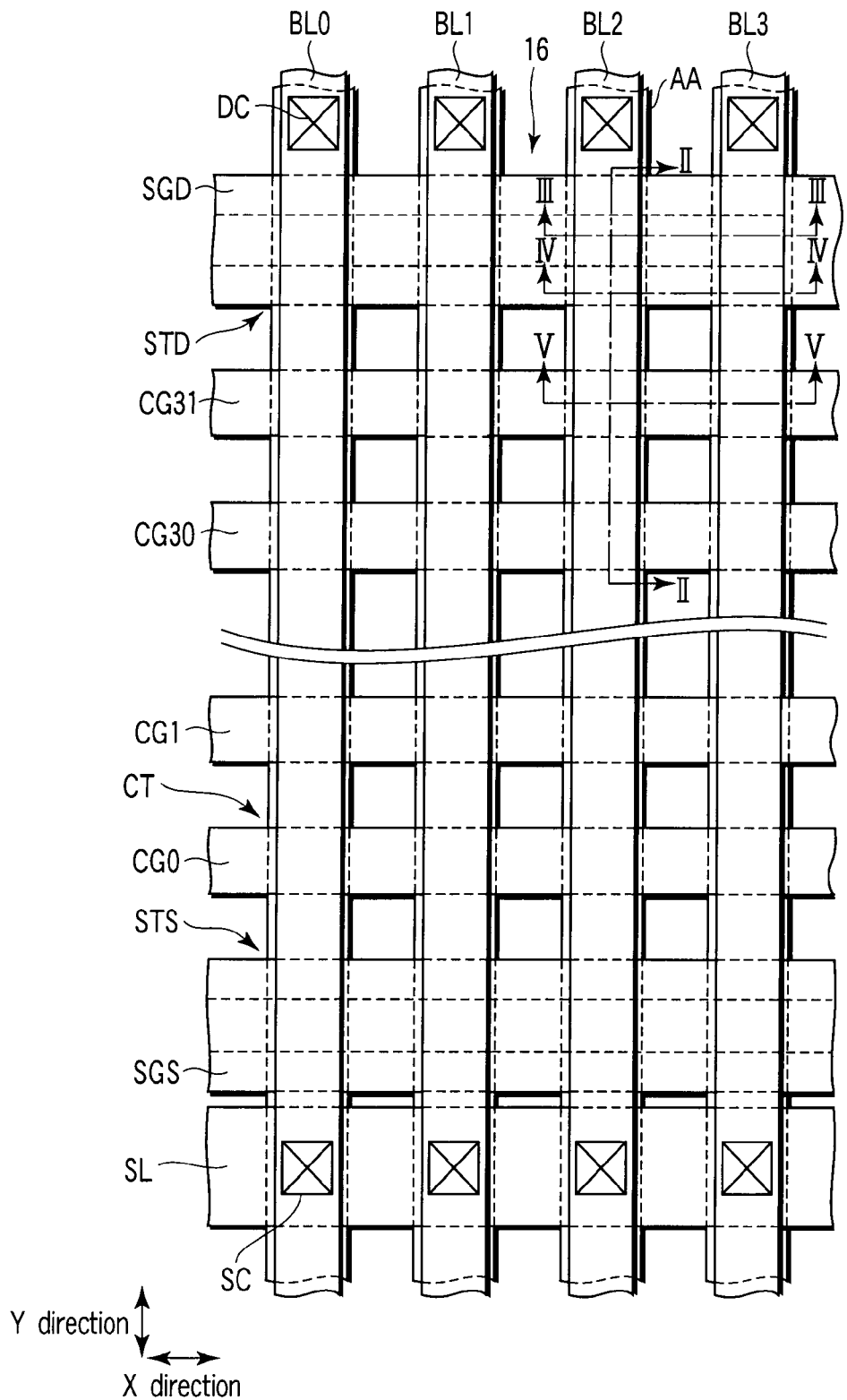
FIG. 1 is a plan view illustrating a NAND flash memory according to an embodiment of the present invention.
Figure 2:
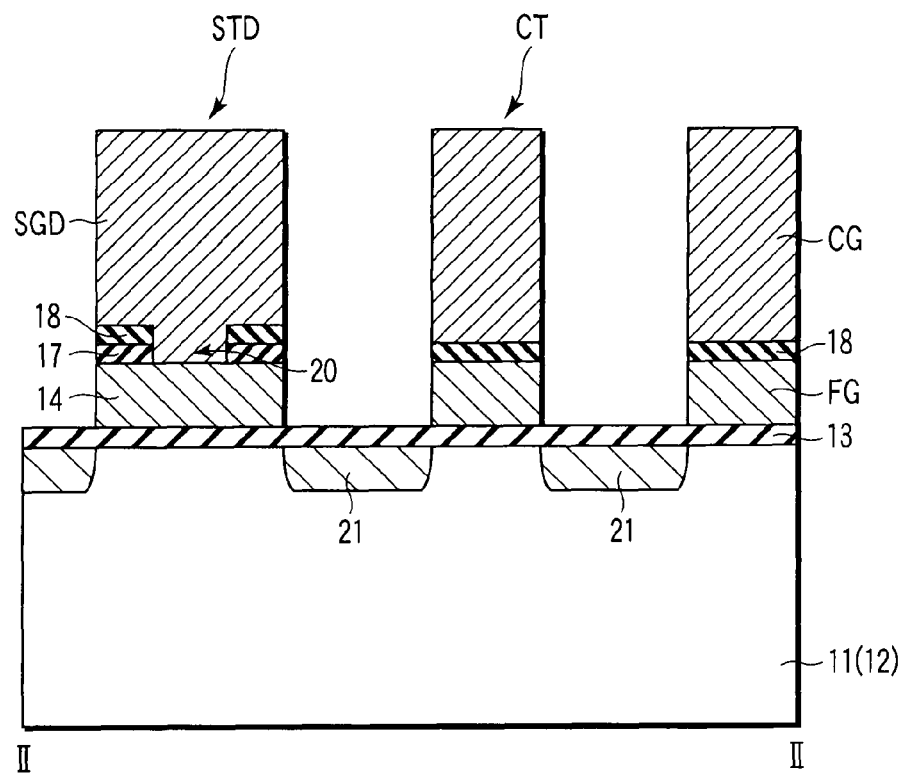
FIG. 2 is a sectional view of the NAND flash memory taken along a line II-II in FIG. 1.
Figure 3:
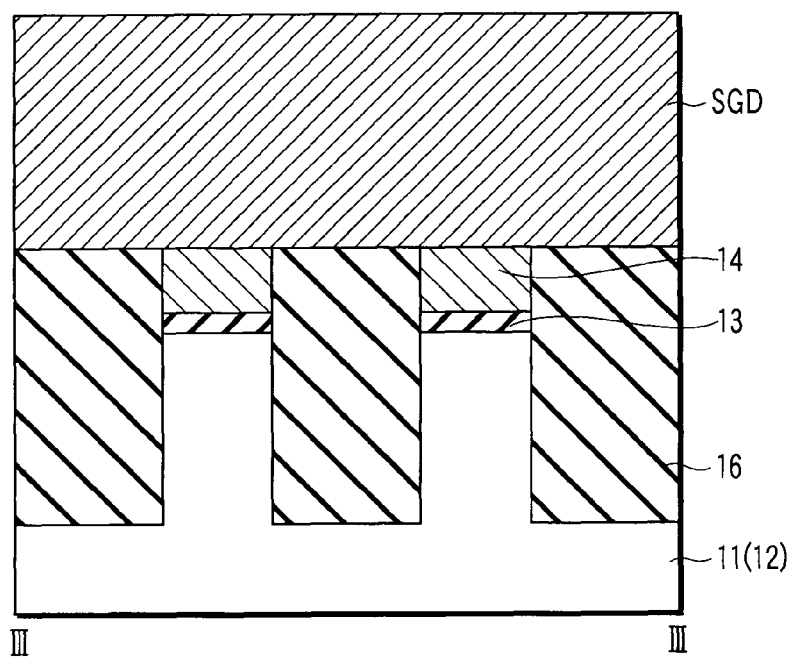
FIG. 3 is a sectional view of the NAND flash memory taken along a line III-III in FIG. 1.
Figure 4:
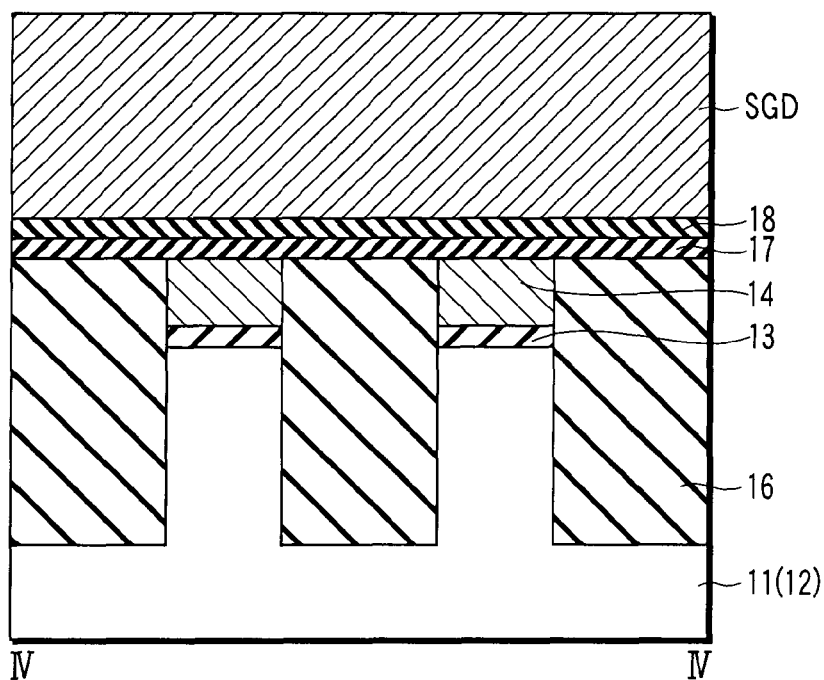
FIG. 4 is a sectional view of the NAND flash memory taken along a line IV-IV in FIG. 1.
Figure 5:
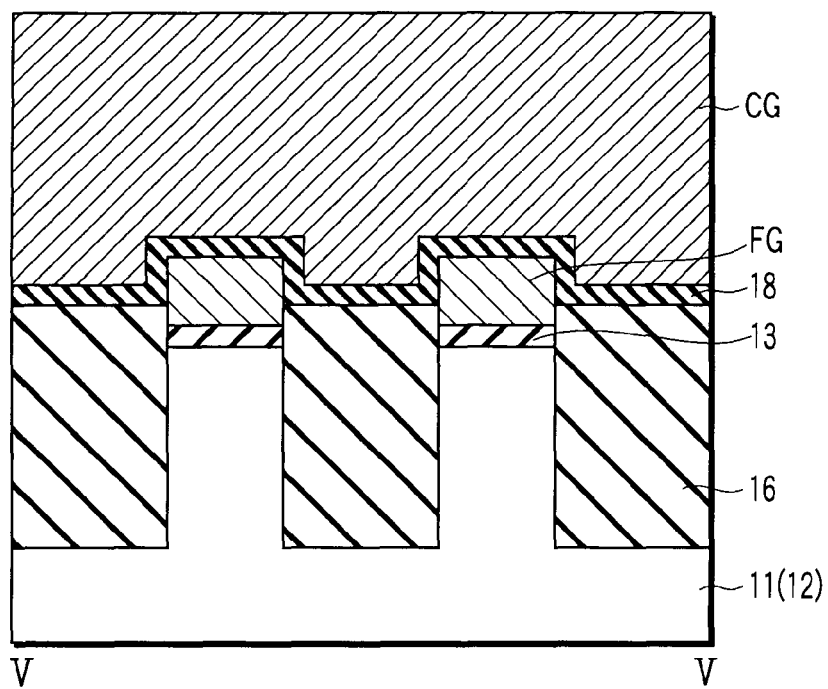
FIG. 5 is a sectional view of the NAND flash memory taken along a line V-V in FIG. 1.

FIG. 1 is a plan view illustrating a NAND flash memory according to the embodiment of the present invention. FIG. 2 is a sectional view of the NAND flash memory taken along a line II-II in FIG. 1. FIG. 3 is a sectional view of the NAND flash memory taken along a line III-III in FIG. 1. FIG. 4 is a sectional view of the NAND flash memory taken along a line IV-IV in FIG. 1. FIG. 5 is a sectional view of the NAND flash memory taken along a line V-V in FIG. 1. Note that to allow easy understanding of the arrangement, bit lines BL and interlayer dielectric films are not shown in the sectional views.

One unit comprises a memory cell string having series-connected memory cell transistors CT (typically, 32 memory cell transistors CT), a selection gate transistor STD connected in series with one end (the drain side) of the memory cell string, and a selection gate transistor STS connected in series with the other end (the source side) of the memory cell string.

Each memory cell transistor CT has a laminated gate structure in which a gate insulating film 13, floating gate electrode FG, inter-gate insulating film 18, and control gate electrode CG are sequentially stacked on a semiconductor substrate 11. Adjacent memory cell transistors CT share source/drain regions 21, so the 32 memory cell transistors CT are connected in series. Data in the memory cell transistor CT is changed by injecting electrons into or drawing electrons from the floating gate electrode FG of the memory cell transistor CT.

The floating gate electrodes FG are arranged in the form of islands on the gate insulating films 13 on the semiconductor substrate in one-to-one correspondence with the memory cell transistors. On the other hand, each control gate electrode CG extends in the X direction and is shared by a plurality of memory cell transistors adjacent to each other in the X direction on the same row.

The control gate electrode CG of the memory cell transistor CT is a word line WL. A gate electrode SGD of the selection gate transistor STD on the drain side is a first selection gate line. A gate electrode SGS of the selection gate transistor STS on the source side is a second selection gate line. The drain region of the selection gate transistor STD is connected to a bit line BL running in the Y direction via a contact DC. The source region of the selection gate transistor STS is connected to a source line SL running in the X direction via a contact SC.

The first and second selection gate lines are respectively formed to control the on/off state of the selection gate transistors STD and STS. The selection gate transistors STD and STS each function as a gate for applying a predetermined voltage to the memory cell transistor CT in the unit when writing, reading, or erasing data.

The NAND flash memory has a memory cell portion, low-voltage peripheral circuit portion, and high-voltage peripheral circuit portion. The memory cell portion comprises the memory cell transistors CT.

The low-voltage peripheral circuit portion comprises metal oxide semiconductor (MOS) transistors that drive at a power supply voltage Vcc (e.g., 2.5 to 3.3V). More specifically, the low-voltage peripheral circuit portion includes the selection gate transistors STD and STS connected to the two ends of the memory cell array.

The high-voltage peripheral circuit portion comprises MOS transistors that handle a voltage higher than the power supply voltage Vcc. More specifically, the high-voltage peripheral circuit portion comprises MOS transistors used in a voltage generator that generates a write voltage Vpgm (e.g., 20V) by using the power supply voltage Vcc. The write voltage Vpgm is used when writing data in the memory cell transistor CT.

A practical structure of the memory cell transistor CT will be explained below with reference to FIGS. 2 to 5. The p-type semiconductor substrate 11 is, e.g., a p-type semiconductor substrate, a semiconductor substrate 11 having a p-type well 12, or a silicon-on-insulator (SOI) substrate having a p-type semiconductor layer. The semiconductor substrate 11 is made of, e.g., silicon (Si). The semiconductor substrate 11 has element isolation insulating layers 16 in the surface region, and those portions of the surface region of the semiconductor substrate 11 in which the element isolation layers 16 are not formed are element regions (active areas [AA]) where elements are formed. The element isolation layer 16 is realized by, e.g., shallow trench isolation (STI). The STI 16 is constituted by, e.g., silicon oxide.

The gate laminated structures obtained by sequentially stacking the gate insulating films 13, floating gate electrodes FG, inter-gate insulating films 18, and control gate electrodes CG forming the memory cell transistors CT are formed on the semiconductor substrate 11. The gate insulating film 13 is made of, e.g., silicon oxide. The floating gate electrode FG is a conductor and made of, e.g., polysilicon. The control gate electrode CG is also a conductor and made of, e.g., polysilicon.

The inter-gate insulating film 18 is, e.g., a high-k film. Examples of the high-k film are aluminum oxide ($Al_2O_3$), hafnium oxide ($HfO_2$), and hafnium aluminate ($HfAl_xO_y$) obtained by adding hafnium (Hf) to aluminum oxide. The coupling ratio of the memory cell transistor CT can be increased by using, as the inter-gate insulating film 18, the high-k film having a dielectric constant higher than that of a silicon oxide film.

Note that letting C2 be the CG-FG capacitance and C1 be the FG-substrate capacitance, "C2/(C1+C2)" represents the coupling ratio. The element characteristics of the memory cell transistor CT can be improved by increasing the coupling ratio. More specifically, the data holding characteristic of the memory cell transistor CT improves.

The source/drain regions 21 of the memory cell transistors CT are formed in the semiconductor substrate 11 (more specifically, in the element regions AA) on the two sides of the gate laminated structure. Adjacent memory cell transistors CT share one source/drain region 21. In this manner, the memory cell transistors CT are formed.

The threshold voltage of the memory cell transistor CT changes when electric charge is injected into the floating gate electrode FG or electric charge stored in the floating gate electrode FG is drawn. More specifically, a bidirectional high electric field is applied between the channel region and control gate electrode CG of the memory cell transistor CT by changing the potential difference between them. This bidirectional high electric field injects electric charge into the floating gate electrode FG or draws electric charge stored in the floating gate electrode FG. This makes it possible to program data in the memory cell transistor CT.

The structure of the selection gate transistor STD will be explained below with reference to FIGS. 2 to 4. The gate insulating films 13 are formed on the semiconductor substrate 11. First gate electrodes 14 are formed on the gate insulating films 13. The first gate electrodes 14 are formed in the step of forming the floating gate electrodes FG, and are made of the same material and having the same film thickness as the floating gate electrodes FG. Similar to the floating gate electrodes FG, the first gate electrodes 14 are arranged in the form of islands on the gate insulating films 13 on the semiconductor substrate 11 in one-to-one correspondence with the selection gate transistors STD.

A first inter-gate insulating film 17 having an opening 20 is formed on a portion of the first gate electrode 14. The first inter-gate insulating film 17 is made of, e.g., silicon nitride. A second inter-gate insulating film 18 having an opening 20 is formed on the first inter-gate insulating film 17. The second inter-gate insulating film 18 is made of the same material (i.e., a high-k film) and having the same film thickness as the inter-gate insulating film 18 of the memory cell transistor CT. The second inter-gate insulating film 18 is formed in the step of forming the inter-gate insulating film 18 of the memory cell transistor CT.

The second gate electrode SGD is formed on the first gate electrode 14 (i.e., in the opening 20), on the second inter-gate insulating film 18, and on the element isolation insulating layer 16 in a peripheral circuit portion. The second gate electrode SGD extends in the X direction and is shared by a plurality of selection gate transistors adjacent in the X direction (i.e., a plurality of selection gate transistors on the same row). The first gate electrode 14 and second gate electrode SGD are electrically connected. In practice, therefore, the gate electrode of the selection gate transistor STD is made up of the first gate electrode 14 and second gate electrode SGD.

The source/drain regions 21 of the selection gate transistor STD are formed in the semiconductor substrate 11 (more specifically, the element regions AA) on the two sides of the gate electrode SGD. The selection gate transistor STD and the memory cell transistor CT adjacent to it share one source/drain region 21. In this manner, the selection gate transistor STD is formed.

Note that the structure of the selection gate transistor STS is the same as the selection gate transistor STD. Note also that the MOS transistor included in the high-voltage peripheral circuit portion has the same structure as the selection gate transistor STS except for the film thickness of the gate insulating film.

As shown in FIG. 3, in the selection gate transistor STD, the upper surface of the element isolation insulating layer 16 immediately below the second gate electrode SGD is almost leveled with the upper surface of the first gate electrode 14. That is, the distance from the upper surface of the semiconductor substrate 11 to the lowermost surface of the second gate electrode SGD is the same as the total film thickness of the first gate electrode 14 and gate insulating film 13.

This is possible because the STI 16 immediately below the second gate electrode SGD is not etched in the step of forming the second gate electrode SGD. Since it is thus possible to increase the distance between the upper surface of the semiconductor substrate 11 and the lowermost surface of the second gate electrode SGD, a short circuit (electrical connection) between the semiconductor substrate 11 and second gate electrode SGD can be prevented in the selection gate transistor STD. It is also possible to further thin the first gate electrode 14 made of the same material and having the same film thickness as the floating gate electrode FG.

On the other hand, as shown in FIG. 5, the upper surface of the STI 16 immediately below the control gate electrode CG is lower than the upper surface of the floating gate electrode FG in the memory cell transistor CT. That is, the control gate electrode CG is also formed on the inter-gate insulating film 18 on the upper surface and side surfaces of the floating gate electrode FG. Since this increases the area in which the control gate electrode CG and floating gate electrode FG oppose each other, the coupling ratio of the memory cell transistor CT can be increased.

Also, the film thickness of the floating gate electrode FG can be further decreased because there is no limitation on the film thickness of the first gate electrode 14 in the selection gate transistors STD and STS. This makes it possible to reduce the parasitic capacitance of the floating gate electrode FG, thereby suppressing the inter-cell interference.

In this embodiment as described above, the upper surface height of the element isolation insulating layer 16 in the peripheral circuit portion having the selection gate transistors STD and STS is different from that in the memory cell portion having the memory cell transistors CT.

Figure 21:
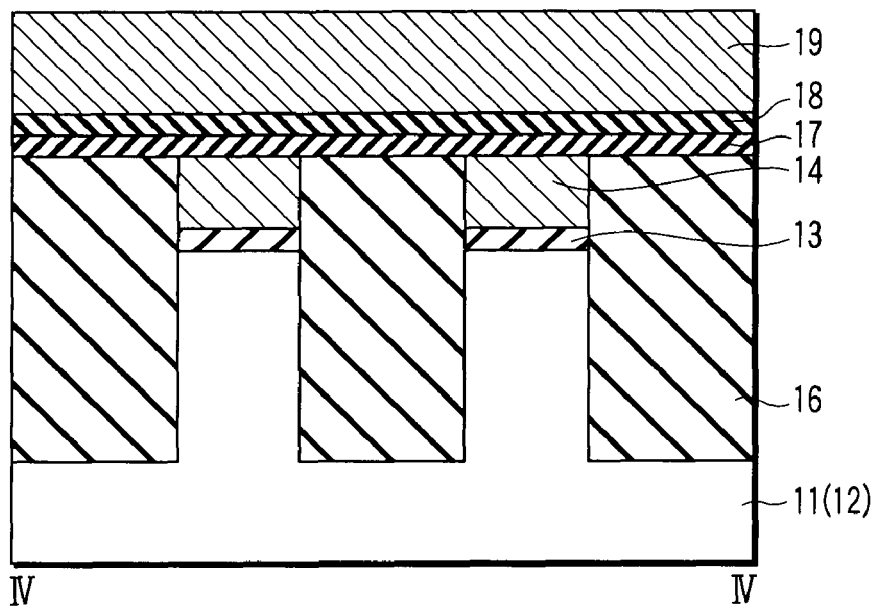
FIG. 21 is a sectional view taken along the line IV-IV and illustrating a manufacturing step of the NAND flash memory following FIG. 17.
Figure 22:
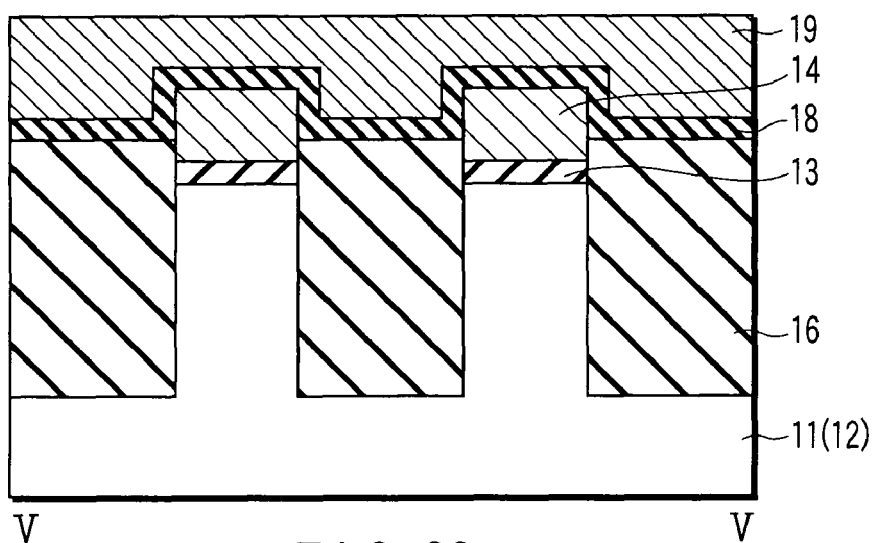
FIG. 22 is a sectional view taken along the line V-V and illustrating a manufacturing step of the NAND flash memory following FIG. 18.
Figure 23:
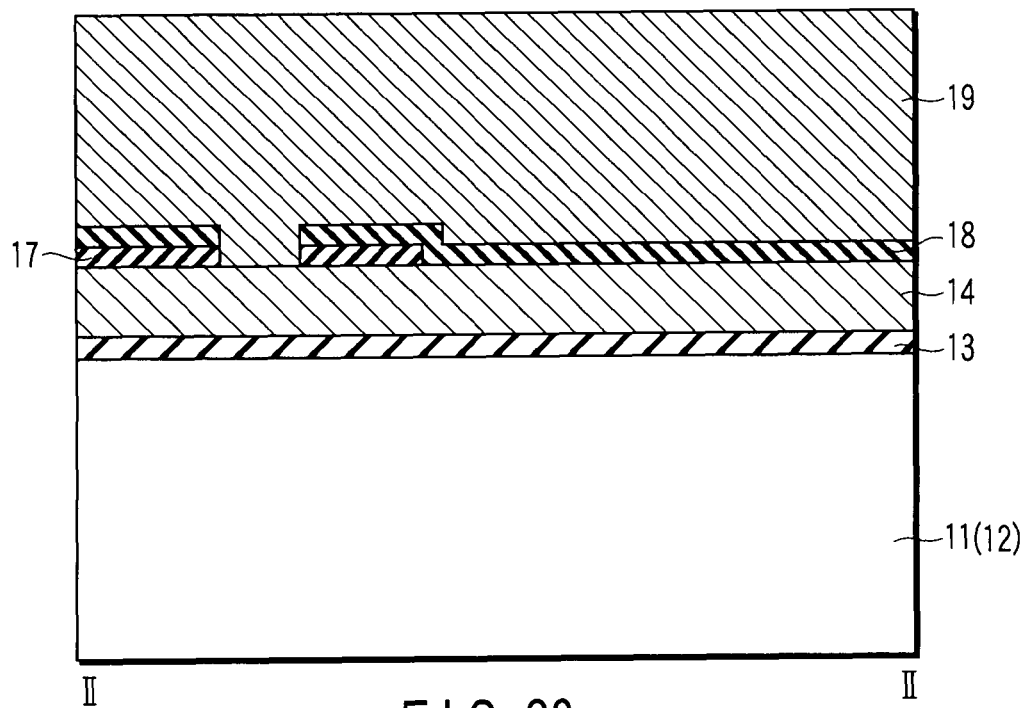
FIG. 23 is a sectional view taken along the line II-II and illustrating a manufacturing step of the NAND flash memory following FIG. 19.
Figure 24:
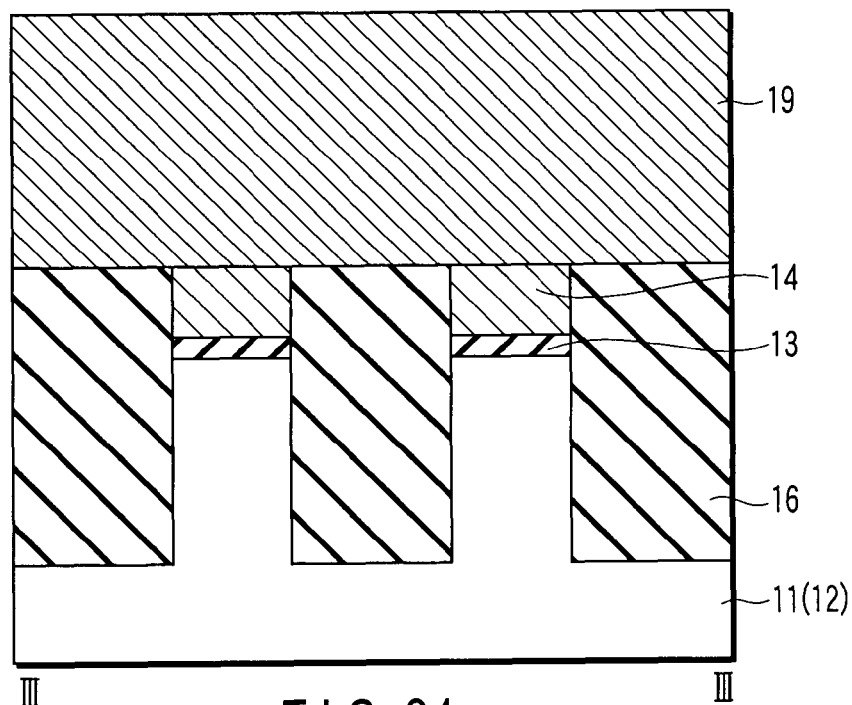
FIG. 24 is a sectional view taken along the line III-III and illustrating a manufacturing step of the NAND flash memory following FIG. 20.

An example of a manufacturing method of the NAND flash memory will be explained below with reference to the accompanying drawing. FIGS. 6, 7, 9, 11, 13, 16, 19, 23, and 27 are sectional views taken along the line II-II in FIG. 1. FIGS. 8, 10, 12, 14, 17, 20, 24, and 28 are sectional views taken along the line III-III in FIG. 1. FIGS. 21, 25, and 29 are sectional views taken along the line IV-IV in FIG. 1. FIGS. 15, 18, 22, 26, and 30 are sectional views taken along the line V-V in FIG. 1.

First, as shown in FIG. 6, a p⁻-type impurity (e.g., boron [B]) is lightly doped into a desired region on a semiconductor substrate 11 made of Si (silicon), thereby forming a well 12 in the semiconductor substrate 11. Then, ion implantation is performed in the well 12 to control the impurity concentration of a channel region.

Subsequently, a gate insulating film 13 made of, e.g., silicon oxide is formed on the well 12. In this step, the gate insulating film 13 about 8.5 nm thick is formed on a low-voltage element region (including a memory cell portion and low-voltage peripheral circuit portion). On the other hand, a gate insulating film about 40 nm thick is formed on a high-voltage element region (including a high-voltage peripheral circuit portion). Note that the high-voltage peripheral circuit portion is not shown.

A conductive layer (polysilicon layer) 14 about 50 nm thick is then deposited on the gate insulating film 13. The polysilicon layer 14 serves as the floating gate electrodes FG of the memory cell transistors CT, and the first gate electrodes 14 of the selection gate transistors STD and STS. An insulating layer (silicon nitride layer) 15 about 70 nm thick is deposited on the polysilicon layer 14.

As shown in FIGS. 7 and 8 (sections taken along the lines IV-IV and V-V are the same as FIG. 8), a resist film (not shown) that exposes prospective regions of element isolation insulating layers 16 is formed on the silicon nitride layer 15 by lithography. This resist film is used as a mask material to sequentially etch the silicon nitride layer 15/polysilicon layer 14/gate insulating film 13/semiconductor substrate 11 by reactive ion etching (RIE), thereby forming element isolation trenches. The depth of the element isolation trenches is set to about 250 nm from the upper surface of the semiconductor substrate 11. After that, the resist film is removed.

The surface of the semiconductor substrate 11 exposed by the RIE step is oxidized by about 2 nm by thermal oxidation, thereby forming a silicon oxide film (not shown) on the surface of the semiconductor substrate 11. Then, an insulating layer (silicon oxide layer) 16 about 500 nm thick is deposited on the entire device by high-density plasma chemical vapor deposition (HDP-CVD), thereby filling the element isolation trenches with the silicon oxide layer 16.

Subsequently, chemical mechanical polishing (CMP) is used to planarize the silicon oxide layer 16 and etch it to the upper surface of the silicon nitride layer 15. Consequently, STIs 16 as element isolation insulating layers are formed in desired regions.

Figure 9:
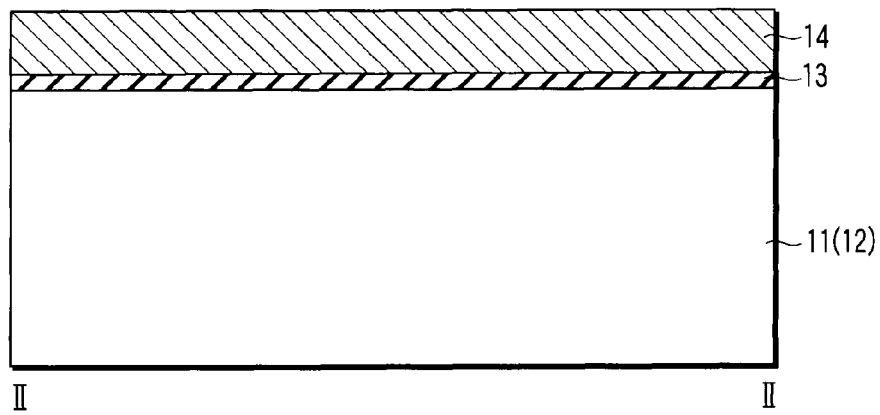
FIG. 9 is a sectional view taken along the line II-II and illustrating a manufacturing step of the NAND flash memory following FIG. 7.
Figure 10:
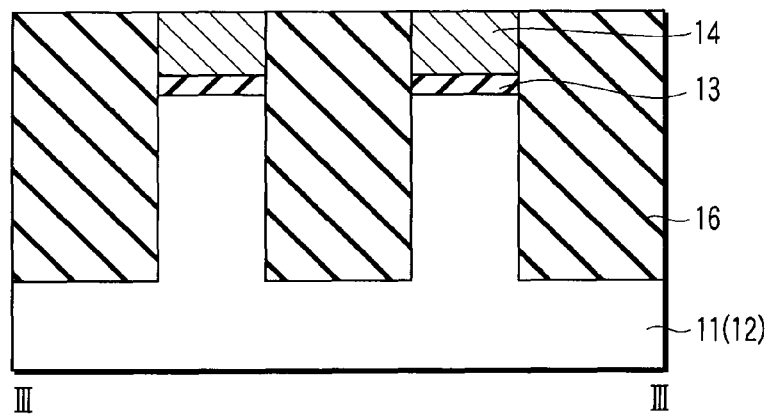
FIG. 10 is a sectional view taken along the line III-III and illustrating a manufacturing step of the NAND flash memory following FIG. 8.

As shown in FIGS. 9 and 10 (sections taken along the lines IV-IV and V-V are the same as FIG. 10), the STIs 16 are etched to the upper surfaces of the polysilicon layers 14 by RIE. The silicon nitride layers 15 remaining on the polysilicon layers 14 are then wet-etched by using a liquid chemical such as phosphoric acid ($H_3PO_4$). In this case, the side surfaces of the upper portion of the polysilicon layer 14 are exposed if the amount of the STI 16 becomes less. Therefore, the etching rate is adjusted so as not to excessively etch the STIs 16 when etching the silicon nitride layers 15. In this manner, processing of the STIs 16 is completed.

Figure 11:
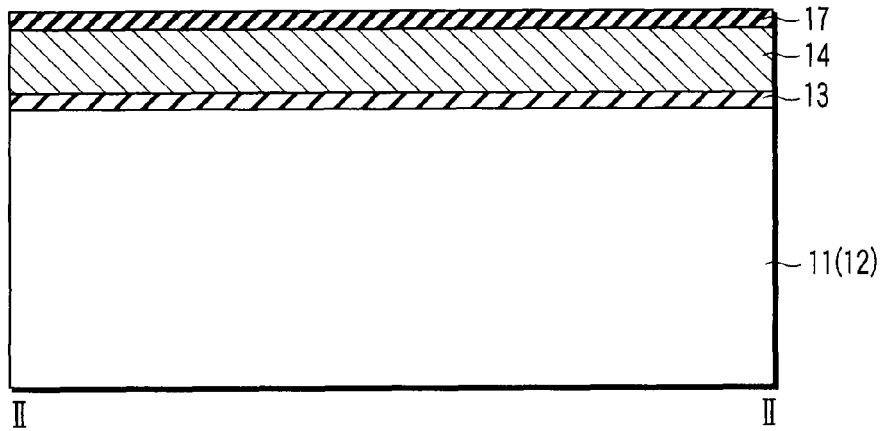
FIG. 11 is a sectional view taken along the line II-II and illustrating a manufacturing step of the NAND flash memory following FIG. 9.

Next, as shown in FIGS. 11 and 12 (sections taken along the lines IV-IV and V-V are the same as FIG. 12), a first inter-gate insulating film 17 is deposited on the entire device by low-pressure chemical vapor deposition (LPCVD). The first inter-gate insulating film 17 is made of a material having a high etching selectivity to a second inter-gate insulating film 18. An example is a silicon nitride film about 5 nm thick.

Figure 15:
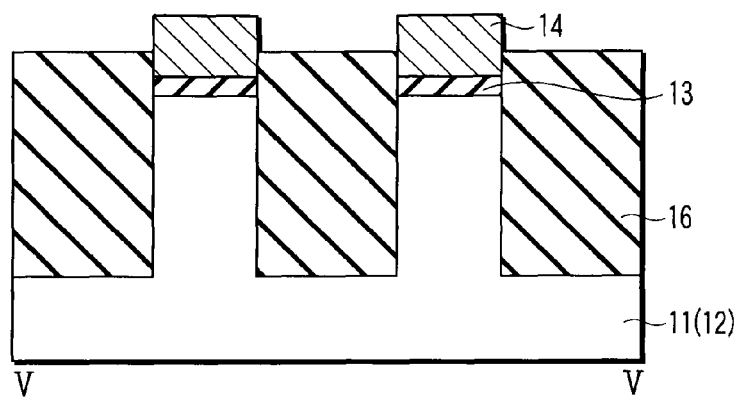
FIG. 15 is a sectional view taken along the line V-V and illustrating a manufacturing step of the NAND flash memory following FIG. 12.

Then, as shown in FIGS. 13 to 15, a resist film (not shown) that exposes the memory cell portion is formed on the first inter-gate insulating film 17 by lithography. Note that a section taken along the line IV-IV is the same as FIG. 14. This resist film is used as a mask material to etch the first inter-gate insulating film 17 by RIE. As a consequence, the first inter-gate insulating film 17 remains in only the low-voltage peripheral circuit portion (and the high-voltage peripheral circuit portion).

In addition, the STIs 16 are etched to a desired depth (in this embodiment, about 33 nm) by RIE in order to increase the coupling ratio of the memory cell transistor CT. Note that this STI 16 etching step is performed such that the upper surface of the STI 16 is positioned between the upper surface and bottom surface of the polysilicon layer 14. In this step, as shown in FIG. 14, the STIs 16 are not etched and the height of the STIs 16 remains unchanged in the low-voltage peripheral circuit portion (and the high-voltage peripheral circuit portion). After that, the resist film is removed, and cleaning is performed.

Figure 16:
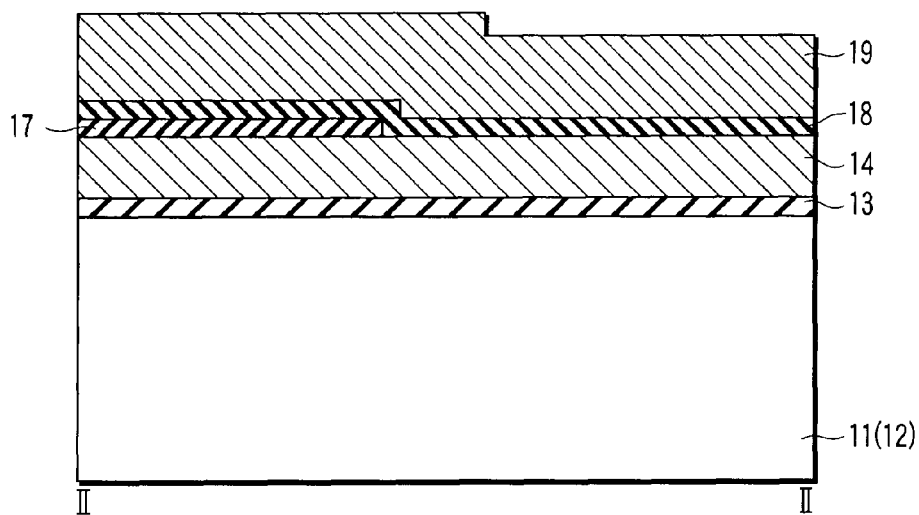
FIG. 16 is a sectional view taken along the line II-II and illustrating a manufacturing step of the NAND flash memory following FIG. 13.
Figure 17:
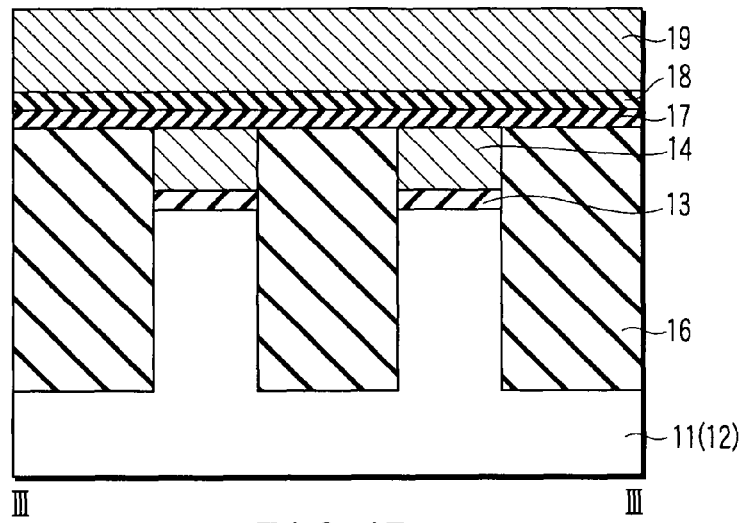
FIG. 17 is a sectional view taken along the line III-III and illustrating a manufacturing step of the NAND flash memory following FIG. 14.
Figure 18:
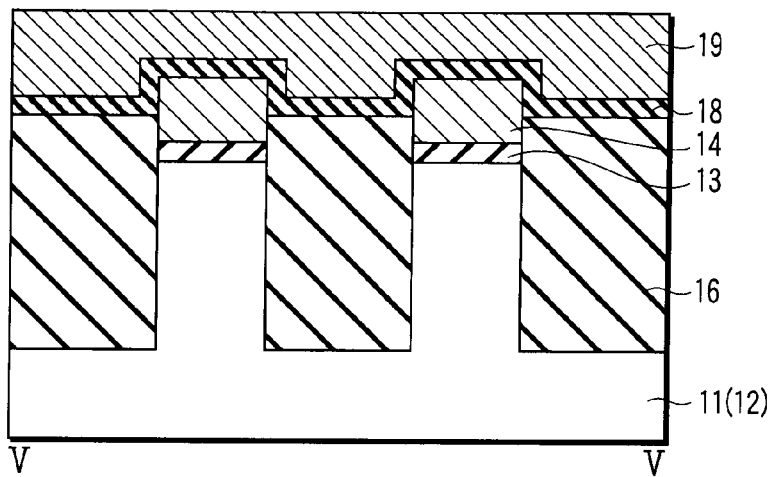
FIG. 18 is a sectional view taken along the line V-V and illustrating a manufacturing step of the NAND flash memory following FIG. 15.
Figure 19:
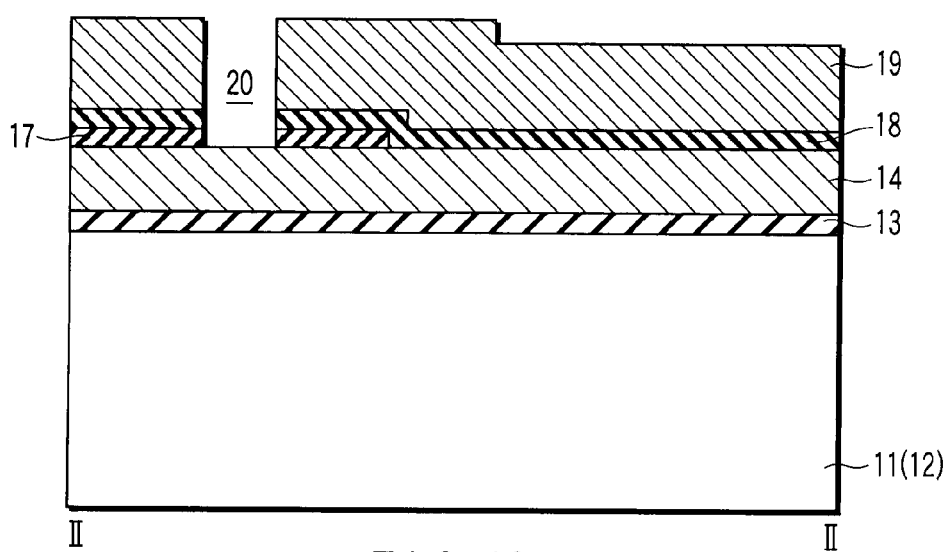
FIG. 19 is a sectional view taken along the line II-II and illustrating a manufacturing step of the NAND flash memory following FIG. 16.
Figure 20:
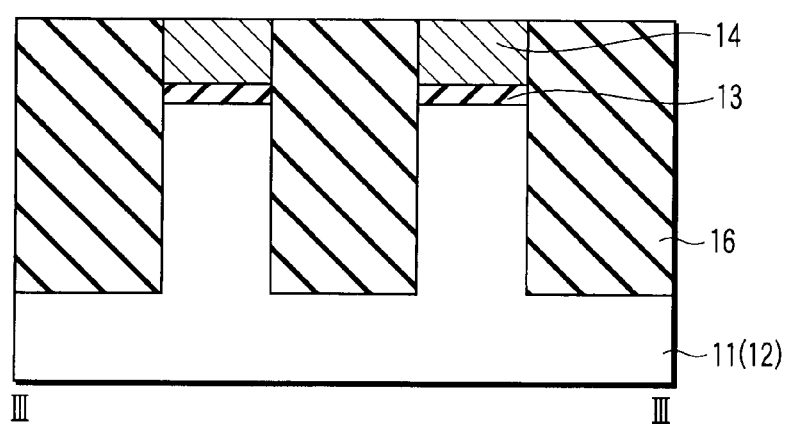
FIG. 20 is a sectional view taken along the line III-III and illustrating a manufacturing step of the NAND flash memory following FIG. 17.

As shown in FIGS. 16 to 18, a second inter-gate insulating film 18 is deposited on the whole device. Note that a section taken along the line IV-IV is the same as FIG. 17. The second inter-gate insulating film 18 is made of a high-k film about 20 nm thick. Then, a conductive layer (polysilicon layer) 19 about 40 nm thick is deposited on the second inter-gate insulating film 18. The polysilicon layer 19 serves as the control gate electrode CG of the memory cell transistor CT and the second gate electrode SGD of the selection gate transistor STD.

As shown in FIGS. 19 to 22, an opening 20 for short-circuiting the second gate electrode SGD of the selection gate transistor STD and the first gate electrode 14 is formed. That is, a resist film (not shown) that exposes a prospective region of the opening 20 is formed on the polysilicon layer 19 by lithography. This resist film is used as a mask material to sequentially etch the polysilicon layer 19/second inter-gate insulating film 18 by RIE.

Subsequently, the resist film for forming the opening 20 is removed. In this step, the upper surface of the polysilicon layer 19 is cleaned by using a liquid chemical containing hydrogen fluoride (HF). In this cleaning step, the upper surface of the STI 16 in the peripheral circuit portion does not become lower because the first inter-gate insulating film 17 remains on the STI 16.

Next, the first inter-gate insulating film 17 remaining on the polysilicon layers 14 is wet-etched by using a liquid chemical such as phosphoric acid ($H_3PO_4$). This exposes the upper surfaces of the polysilicon layers 14. The STIs 16 are not reduced in this wet etching step.

In this way, the opening 20 for short-circuiting the second gate electrode SGD and first gate electrode 14 of the selection gate transistor STD is formed in only the low-voltage peripheral circuit portion (and the high-voltage peripheral circuit portion) where the selection gate transistors STD and STS are formed. Note that the opening 20 does not exist in the memory cell portion because it is unnecessary to electrically connect the floating gate electrode FG and control gate electrode CG.

Assume, for example, that the second inter-gate insulating film 18 made of a high-k film is directly formed on the STI 16 without forming the first inter-gate insulating film 17 made of a silicon nitride film. In this case, the STI 16 is etched at the same time as the high-k film is etched, so the upper surface of the STI 16 in the low-voltage peripheral circuit portion becomes lower.

In this embodiment, however, the first inter-gate insulating film 17 is formed between the polysilicon layer 14 and second inter-gate insulating film 18 in the low-voltage peripheral circuit portion. Since the second inter-gate insulating film (high-k film) 18 has an etching selectivity of 5 or more to the first inter-gate insulating film (silicon nitride film) 17, the STI 16 below the first inter-gate insulating film 17 is not etched even when the second inter-gate insulating film 18 is etched. Furthermore, the wet etching step of the first inter-gate insulating film 17 does not lower the upper surface of the STI 16.

Then, as shown in FIGS. 23 to 26, a conductive layer (polysilicon layer) about 160 nm thick is deposited on the whole device. This polysilicon layer fills the opening 20 and increases the film thickness of the polysilicon layer 19, thereby forming a polysilicon layer 19 serving as the control gate electrode CG and second gate electrode SGD. Also, in the low-voltage peripheral circuit portion, the polysilicon layer buried in the opening 20 electrically connects the polysilicon layers 14 and 19. After that, the upper surface of the polysilicon layer 19 is planarized by CMP.

As shown in FIGS. 27 to 30, a resist film having the same planar shapes as the control gate electrode CG and the second gate electrode SGD of the selection gate transistor STD is formed on the polysilicon layer 19 by lithography. This resist film is used as a mask material to sequentially etch the polysilicon layer 19/second inter-gate insulating film 18/first inter-gate insulating film 17/polysilicon layer 14 by RIE so as to transfer the resist pattern. Consequently, a floating gate electrode FG and control gate electrode CG are formed in the memory cell portion, and a first gate electrode 14 and second gate electrode SGD are formed in the peripheral circuit portion. After that, the resist film is removed.

As shown in FIGS. 2 to 5, an $n^+$-type impurity (e.g., phosphorus [P] or arsenic [As]) is heavily doped into the semiconductor substrate 11. Annealing is then performed to recover crystal defects and electrically activate the implanted impurity. As a consequence, source/drain regions 21 of the memory cell transistor CT and selection gate transistor STD are formed in the semiconductor substrate 11.

Next, an interlayer dielectric film made of, e.g., tetra-ethyl-ortho-silicate (TEOS) is deposited. After that, contacts to be connected to the source/drain regions 21 of the selection gate transistors STD and STS are formed. In addition, bit lines BL and a source line SL connected to these contacts and the like are formed.

Note that a manufacturing method of the selection gate transistor STS is the same as the selection gate transistor STD. Note also that a manufacturing method of MOS transistors included in the high-voltage peripheral circuit portion is the same as the selection gate transistor STS except for the film thickness of the gate insulating film.

In this embodiment as described in detail above, in the selection gate transistors STD and STS included in the peripheral circuit portion, two insulating films, i.e., the first inter-gate insulating film 17 made of a silicon nitride film and the second inter-gate insulating film 18 made of a high-k film are formed on the first gate electrode 14 formed on the gate insulating film 13 and made of the same material and having the same film thickness as the floating gate electrode FG. Also, the upper surfaces of the element isolation insulating layers 16 immediately below the second gate electrodes SGD and SGS are almost leveled with the upper surfaces of the first gate electrodes 14.

In the selection gate transistors STD and STS, therefore, it is possible to prevent short circuits between the semiconductor substrate 11 and second gate electrodes SGD and SGS. As a result, the decrease in yield can be suppressed. It is also possible to further thin the first gate electrode 14 made of the same material and having the same film thickness as the floating gate electrode FG.

In the memory cell transistor CT, only the inter-gate insulating film 18 made of a high-k film is formed between the floating gate electrode FG and control gate electrode CG. Also, the upper surface of the STI 16 immediately below the control gate electrode CG is lower than that of the floating gate electrode FG. This makes it possible to increase the coupling ratio of the memory cell transistor CT.

Furthermore, in each of the selection gate transistors STD and STS, the film thickness of the floating gate electrode FG can be further decreased because there is no limitation on the film thickness of the first gate electrode 14. This makes it possible to reduce the parasitic capacitance of the floating gate electrode FG, thereby suppressing the inter-cell interference.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory including a memory cell transistor and a selection gate transistor, comprising:
   a semiconductor substrate including a first upper surface having a pair of element isolation regions and an active region located between the element isolation regions, the element isolation regions and active region extending to a first direction, respectively;
   a selection gate line formed above the semiconductor substrate, the selection gate line extending to a second direction which is perpendicular to the first direction;

a word line formed above the semiconductor substrate, the word line extending to the second direction;

a lower gate electrode of the selection gate transistor located between the selection gate line and the active region, the lower gate electrode having a second upper surface;

a floating gate electrode of the memory cell transistor located between the word line and the active region, the floating gate electrode including a third upper surface;

insulators formed in the element isolation regions, each of the insulators including a fourth upper surface located below the selection gate line and a fifth upper surface located below the word lines, a height of the fifth upper surface being lower than a height of the third upper surface of the floating gate electrode and a height of the fourth upper surface being the same as a height of the second upper surface of the lower gate electrode related to the first upper surface of the semiconductor substrate;

a first inter-layer insulating film formed between the selection gate line and the lower gate electrode, the first inter-layer insulating film including a first opening to connect the selection gate line with the lower gate electrode and a first lower surface contacting with the second upper surface of the lower gate electrode; and a second inter-layer insulating film formed between the word line and the floating gate electrode, and between the selection gate line and the first inter-gate insulating film, the second inter-layer insulating film including a sixth upper surface directly contacting with the word line, a seventh upper surface contacting with the selection gate line, a second lower surface directly contacting with the third upper surface of the floating gate electrode and a third lower surface contacting with the first inter-layer insulating film, wherein the second inter-layer insulating film includes a second opening corresponding to the first opening so as to connect the selection gate line with the lower gate electrode, and the first and second inter-layer insulating films and selection gate line of the selection gate transistor have the same width in the first direction as the lower gate electrode.

2. The memory according to claim 1, wherein a material and film thickness of the lower gate electrode of the selection gate transistor is the same as a material and film thickness of the floating gate electrode of the memory cell transistor.

3. The memory according to claim 1, wherein a material and film thickness of the selection gate line is the same as a material and film thickness of the word line.

4. The memory according to claim 1, wherein the first inter-layer insulating film has etching selectivity to the second inter-layer insulating film.

5. The memory according to claim 1, wherein the first inter-layer insulating film is made of silicon nitride, and the second inter-layer insulating film is made of a high-k material.

6. The memory according to claim 5, wherein the high-k material is selected from a group consisting of aluminum oxide, hafnium oxide, and hafnium aluminate.

7. The memory according to claim 1, wherein the lower and the floating gate electrodes are made of polysilicon.

8. The memory according to claim 1, wherein side surfaces of the first and second inter-layer insulating films and selection gate line of the selection gate transistor are aligned with a side surface of the lower gate electrode.

* * * * *